United States Patent [19]

Maney et al.

[11] Patent Number: 4,815,912

[45] Date of Patent: Mar. 28, 1989

[54] BOX DOOR ACTUATED RETAINER

[75] Inventors: George A. Maney, Palo Alto; W. George Faraco, Saratoga; Mihir Parikh, San Jose, all of Calif.

[73] Assignee: Asyst Technologies, Inc., Milpitas, Calif.

[21] Appl. No.: 686,443

[22] Filed: Dec. 24, 1984

[51] Int. Cl.$^4$ .............................................. B65B 1/04
[52] U.S. Cl. ...................................... 414/217; 312/312
[58] Field of Search ................... 414/217, 291, 292, 8, 414/221, 222, 287, 303, 331, 414, 403–405, 422, 572; 220/85 B, 403, 404, 211, 326; 206/216, 328, 445, 454, 499, 501; 312/1, 10, 21, 24, 31, 117, 296, 312

[56] References Cited

U.S. PATENT DOCUMENTS

| | | | |
|---|---|---|---|
| 2,861,714 | 11/1958 | Glossop | 220/85 B X |
| 3,216,198 | 11/1965 | Brooks | 220/85 B X |
| 4,119,263 | 10/1978 | Cuthbertson et al. | 414/414 X |
| 4,135,635 | 1/1979 | Fujii et al | 220/85 B |
| 4,260,312 | 4/1981 | Hackney | 414/292 |
| 4,336,438 | 6/1982 | Uehara et al. | 414/222 X |
| 4,343,584 | 8/1982 | Hudgins | 414/222 |
| 4,412,771 | 11/1983 | Gerlach et al. | 414/217 |
| 4,433,951 | 2/1984 | Koch et al. | 414/217 |
| 4,483,440 | 11/1984 | Ware | 206/216 |
| 4,532,970 | 8/1985 | Tullis et al. | 414/217 X |
| 4,534,389 | 8/1985 | Tullis | 414/292 X |
| 4,616,683 | 10/1986 | Tullis et al. | 414/217 X |

OTHER PUBLICATIONS

SMIF: A Technology for Wafer Cassette Transfer in VLSI Manufacturing by Mihir Parikh and Ulrich Kaemph, Jul. 1984.

Primary Examiner—Robert J. Spar
Assistant Examiner—David A. Bucci
Attorney, Agent, or Firm—Fliesler, Dubb, Meyer & Lovejoy

[57] ABSTRACT

A transportable container for articles to be processed, for use with a passage elevator for passing the articles between locations, is provided which comprises: a box defining a box opening; a box door for being received by the box opening; a cassette for holding the articles, the cassette supported by the box door and sized for passage through the box opening, the passage elevator passing the cassette through the box opening; a retainer, extending adjacent to the cassette, for substantially retaining the articles held by the cassette, the retainer being movably coupled to the box such that the retainer can move in a direction substantially transverse to a direction of movement of the holder substantially during a passage of the cassette through the box opening.

19 Claims, 5 Drawing Sheets

BOX DOOR ACTUATED RETAINER

CROSS-REFERENCE TO RELATED APPLICATION:

SEALED STANDARD INTERFACE APPARATUS, Inventors: George Allen Maney, Andrew William O'Sullivan, W. George Faraco, Ser. No. 635,384 Filed: July 30, 1984.

BACKGROUND OF THE INVENTION

The present invention relates to standardized mechanical interface systems for reducing particle contamination and more particularly to apparatus employing sealed containers suitable for use in semiconductor processing equipment to prevent particle contamination.

A standardized mechanical interface (SMIF) has been proposed to reduce particle contamination by significantly reducing particle fluxes onto wafers. This end is accomplished by mechanically ensuring that during transport, storage and processing of the wafers, the gaseous media (such as air or nitrogen) surrounding the wafers is essentially stationary relative to the wafers and by ensuring that particles from the ambient outside environment do not enter the immediate internal wafer environment.

Control of particulate contamination is imperative for cost effective, high-yielding and profitable manufacturing of VLSI circuits. Because design rules increasingly call for smaller and smaller lines and spaces, it is necessary to exert greater and greater control on the number of particles and to remove particles with smaller and smaller diameters.

Some contamination particles cause incomplete etching in spaces between lines, thus leading to an unwanted electrical bridge. In addition to such physical defects, other contamination particles may cause electrical failure due to induced ionization or trapping centers in gate dielectrics or junctions.

The main sources of particulate contamination are personnel, equipment, and chemicals. Particles given off by personnel are transmitted through the environment and through physical contact or migration onto the wafer surface. People, by shedding of skin flakes, for example, are a significant source of particles that are easily ionized and cause defects. Although clean room garments reduce particle emissions they do not fully contain the emissions. It has been found that as many as 6000 particles per minute are emitted into an adjacent one cubic foot of space by a fully suited operator.

To control contamination particles, the trend in the industry is to build more elaborate (and expensive) clean rooms with HEPA and ULPA recirculating air systems. Filter efficiencies of 99.999% and up to ten complete air exchanges per minute are required to obtain an acceptable level of cleanliness.

Particles within the equipment and chemicals are termed "process defects." To minimize process defects, processing equipment manufacturers must prevent machine generated particles from reaching the wafers, and suppliers of gases and liquid chemicals must delivers cleaner products. Most important, a system must be designed that will effectively isolate wafers from particles during storage, transport and transfer into processing equipment. The Standard Mechanical Interface (SMIF) system has been proposed to achieve this goal.

The SMIF concept is based on the realization that a small volume of still, particle-free air, with no internal source of particles, is the cleanest possible environment for wafers. Further details of one proposed system are described in the article "SMIF: A TECHNOLOGY FOR WAFER CASSETTE TRANSFER IN VLSI MANUFACTURING", by Mihir Parikh and Ulrich Kaempf, *Solid State Technology*, July 1984, pp. 111–115 and in the above cross-referenced application.

The proposed SMIF system has three main components, namely, (1) minimum volume, dustproof boxes are used for storing and transporting wafer cassettes; (2) canopies are placed over cassette ports of processing equipment so that the environments inside the boxes and canopies become miniature clean spaces; (3) doors on the boxes are designed to mate with doors on the interface ports on the equipment canopies and the two doors are opened simultaneously so that particles which may have been on the external door surfaces are trapped ("sandwiched") between the doors.

In the proposed SMIF system, a box is placed at the interface port on top of the canopy; latches release the box door and the canpoy port door simultaneously. A mechanical elevator lowers the two doors, with the cassette riding on top, into the canopy covered space. A manipulator picks up the cassette and places it onto the cassette port/elevator of the equipment. After processing, the reverse operation takes place.

The SMIF system has been proved effective by experiments using prototype SMIF components both inside and outside a clean room. The SMIF configuration achieved a ten-fold improvement over the conventional handling of open cassettes inside the clean room.

Modern processing equipment must be concerned with particle sizes which range from below 0.01 micrometers to above 200 micrometers. Particles with these sizes can be very damaging in semiconductor processing. Typical semiconductor processes today employ geometrics which are 1 micrometer and under. Unwanted contamination particles which have geometries measuring greater than 0.1 micrometer substantially interfere with 1 micrometer geometry semiconductor devices. The trend, of course, is to have smaller and smaller semiconductor processing geometries.

In typical processing environments today, "clean rooms" are established in which, through filtering and other techniques, attempts are made to remove particles having geometries of 0.03 micrometer and above. There is a need, however, to improve the processing environment. The conventional "clean room" cannot be maintained as particle free as desired. It is virtually impossible to maintain conventional clean rooms free of particles of a 0.01 micrometer size and below.

For this reason, systems such as the SMIF system have come under consideration. The proposed SMIF systems, however, have not been fully satisfactory. The SMIF systems which have been proposed have not permitted a full seal to be maintained between the interior of the box and the interior of the canopy during a cassette transfer. The mechanisms for latching and unlatching both the doors have not been convenient and adequate for making the cassette transfer. Accordingly, there is a need for improved mechanisms.

The proposed SMIF system, however, has some deficiencies. When SMIF boxes become contaminated, it is very difficult to remove small contaminant particles since the force of attraction of small particles to surfaces of equipment is very high. When small particles become attached to a surface such as a SMIF box, they are not effectively removed by filtration techniques. Circulating and filtering air or other gas within a box does not readily remove the contamination particles which are attracted and held in contact with surfaces.

Whenever an object such as a SMIF box is disturbed, by bumping for example, many small particles are freed from the surface and find their way as contaminants into any semiconductor or other article which is present in the box. Also, moving parts of a box system tend to create contamination particles whenever surfaces rub together. Therefore, it is desirable to avoid movement of articles such as wafers, within a box and to otherwise avoid the rubbing of parts.

While scrubbing and washing techniques have been developed for removing small particles from equipment and surfaces, these processes tend to be cumbersome and furthermore are not entirely effective. Where possible, it is desirable to avoid generation of contamination particles rather than rely upon their removable.

While proposed SMIF systems have been effective for excluding many unwanted contaminants, they have not been fully effective and need to be improved.

SUMMARY OF THE INVENTION

The present invention is a transportable container, such as a box, for maintaining articles to be processed, such as semiconductor wafers, clean. The wafers or other articles to be processed are placed in a holder. A rigid base supports the holder within the container. A retainer is provided for retaining the articles in the holder. The rigid base and holder are retractable from the container into a clean environment whereby the articles can be processed without contamination. When the base is retracted, the retainer is automatically retracted from the articles so that the articles can be removed from the holder.

The retainer includes a tongue which is moved by and in the direction of movement of the box door. The tongue is supported by a parallelogram support which causes the tongue, when moved by the box door, to also move orthogonal to the direction of box door movement. This orthogonal movement causes the tongue to hold the articles in place whenever the box door is closed and to release the articles whenever the box door is opened.

The rigid base functions as a box door which seals the articles into the box. The box including a disposable liner is used to transport the wafers to a port which is an opening in the canopy of the processing equipment. The port is adapted for receiving the box and box door and for transferring the box door and the contents of the box into a region beneath the canopy. The canopy makes a seal with the box. A port door is provided in the canopy opening for closing the port when no box is present. A box door latch is provided for latching the box door to the box whereby a seal is made and released between the box door and the box by operation of the box door latch. A box latch is provided for latching the box to the canopy whereby a seal is made or released between the box and the canopy by the operation of the box latch.

In one particular embodiment, the retainer is a fluoroplastic or other plastic.

In another embodiment of the invention, a box liner is provided with a tongue in one of the liner walls facing wafers in the cassette. The tongue in the liner is positioned between the retainer and the wafers or other articles. The tongue in the liner is actuated to the closed position by the tongue of the retainer. When closed, the tongues of the liner and of the retainer tend to hold the wafers in place. In order to remove the cassette and the wafers, the box door is opened thereby retracting the retainer. The liner is formed with spring loops which cause the liner tongue to retract whenever the retainer tongue is retracted, thereby allowing the wafers and cassette to be withdrawn from the box and liner.

The present invention provides an improved container with a box door activated retainer for transporting articles to be processed.

Additional objects and features of the invention will appear from the following description in which the preferred embodiments of the invention have been set forth in detail in conjunction with the drawings.

DETAILED DESCRIPTION

Figure 1:
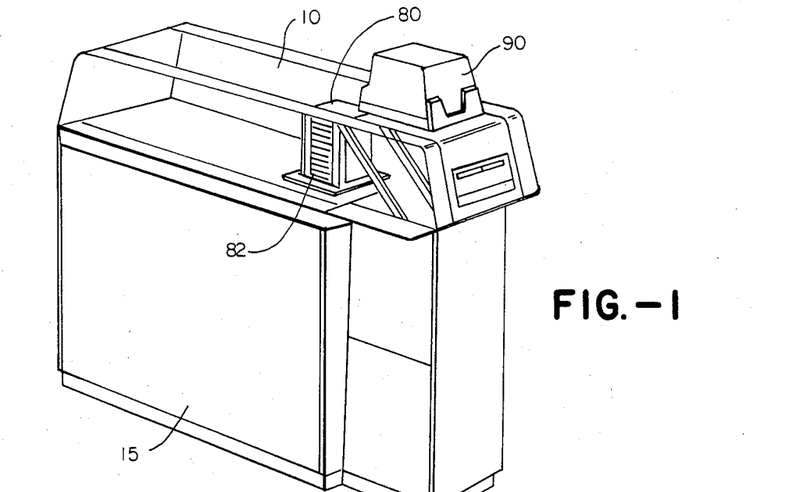
FIG. 1 depicts a perspective view of a SMIF system positioned adjacent processing equipment.

In FIG. 1, the canopy 10 is an easily removable shield that covers the wafer-handling mechanisms of the processing equipment 15. Equipment 15 is a photoresist applicator, mask aligner, inspection station, or any similar processing equipment. The canopy 10 is constructed of transparent plastic such as Lexan to facilitate inspection and/or maintenance within the canopy 10. The canopy 10 encloses the handling mechanisms of the processing equipment 15. The box 90 is located to permit a holder in the form of wafer cassette, holding wafers 82 to be unloaded under the canopy 10 of the equipment 15.

Figure 2:
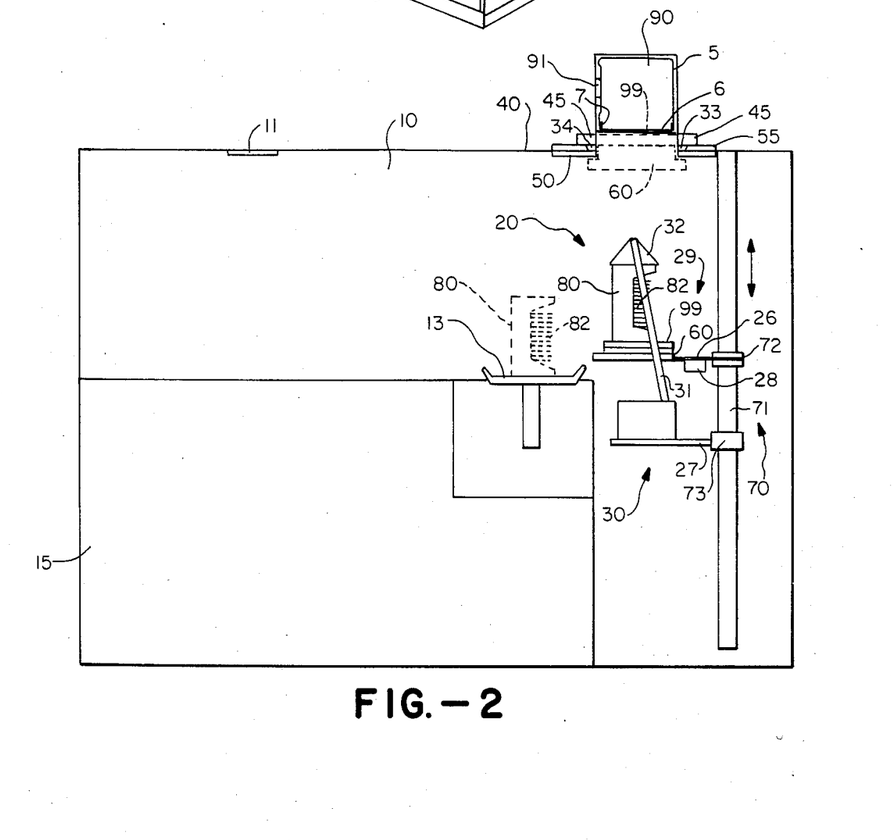
FIG. 2 depicts a schematic representation of the SMIF system and the processing equipment of FIG. 1.

FIG. 2 shows further details of the FIG. 1 apparatus. The box 90 is mounted and held by box latches 45 on an horizontal surface 40 of the canopy 10 by means of a port plate 50. The port assembly 20 further includes a rigid base in the form of a box door 99, a port door 60 and an elevator mechanism 70 that transports a cassette 80, containing the integrated circuit wafers 82, from the box 90 into the region beneath the canopy 10. The box 90 includes a box liner 5 and a base liner 6. When the box and port doors are lowered, the box liner 5 remains within the box while the base liner 6 is lowered with the box door. In FIG. 2, the port door 60 and the box door 99 are shown in the closed positions by broken lines and are shown in the open position by solid lines. The mover assembly 29 includes a platform 26, a shaft engagement means 72, and a drive motor 28.

The platform 26, extending from the elevator assembly 70, carries the port door 60, the box door 99 and, the cassette 80 in a vertical direction. The platform 26 is attached by engagement means 72 to a vertical guide 71 of elevator assembly 70. Typically, guide 71 includes a lead screw (not shown) and motor 28 drives a gear (not shown) which engages the lead screw for driving the platform 26 up or down. When platform 26 is driven to the closed position, the port door 60 closes the port opening in the canopy 10.

In a similar manner, the manipulator assembly 30 is fastened to a platform 27 which has an engagement means 73 for engaging the vertical shaft assembly 71. Manipulator 30 includes a manipulator arm 31 and an engagement head 32 adapted to engage the cassette 30. By vertical operation of the platforms 26 and 27 and operation of the manipulator 30, the cassette 80 is moved from its position on the box door 99 to a position on the equipment station 13 (as shown by the broken lines).

Figure 3:
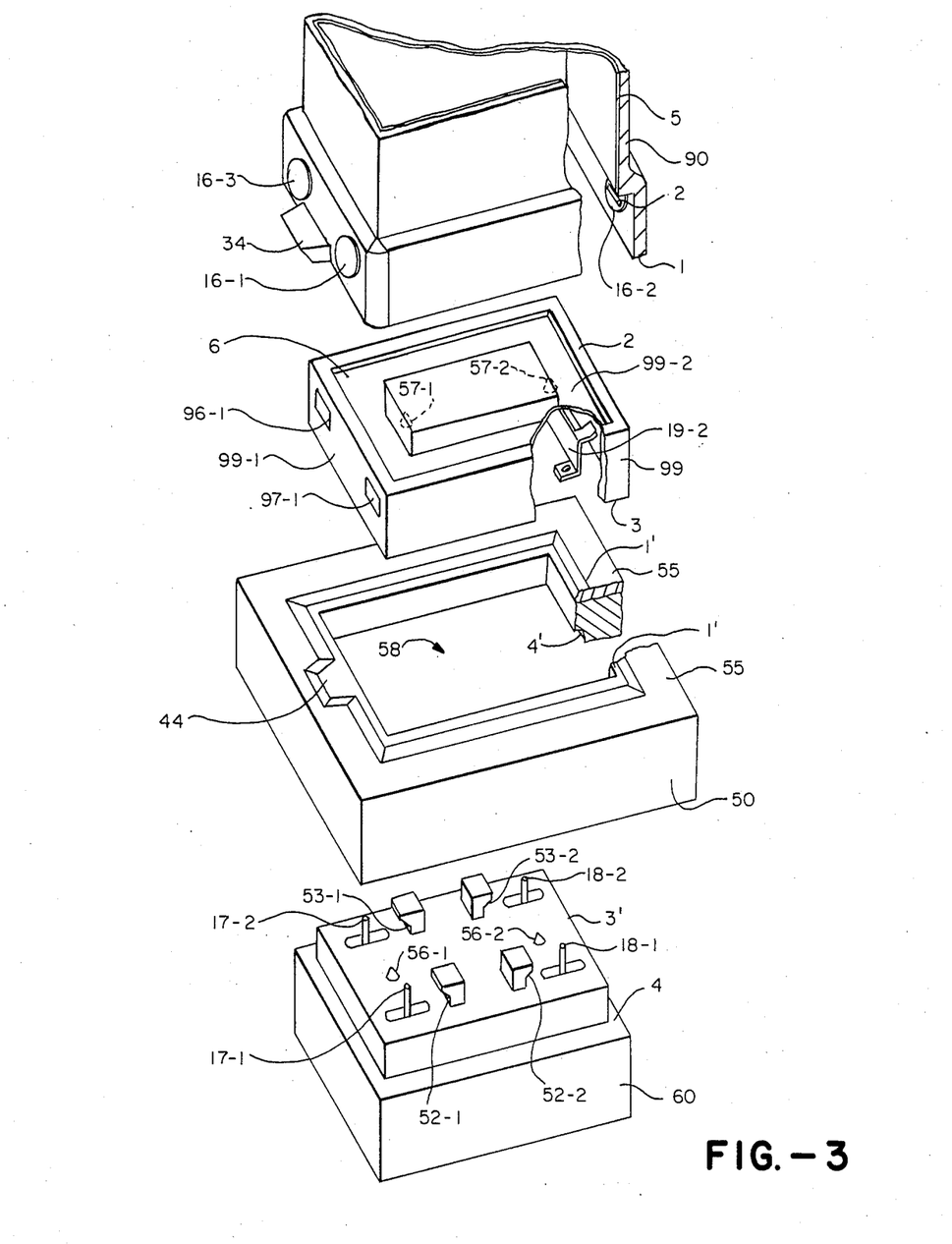
FIG. 3 depicts an exploded partially fragmented perspective view of a port assembly of the FIG. 2 apparatus.

In FIG. 3, an exploded, perspective view of the port assembly 20 is shown in further detail. The box 90 defines a first box perimeter edge 1 and a second box perimeter edge 2 where first and second seals are to be made with the port plate 50 and the port door 99, respectively. The box 90 includes an alignment tab 34 which is received by the alignment opening 44 in the guide rail 55 which forms part of the port plate 50.

In FIG. 3, the box door 99 has a vertical wall 99-1 and a horizontal wall 99-2. The vertical wall has the openings 97-1 and 96-1 which are aligned with the plugs 16-1 and 16-3, respectively. The wall 99-1 extends generally around the perimeter and is terminated at one end by a first box door perimeter edge 2' and at the other end by a second box door perimeter edge 3. Typically, the respective first and second box perimeter edges 1 and 2 and respective first and second box door perimeter edges 2'; and 3 can be machined so that the first box perimeter edge 1 falls in one plane and the second box perimeter edge 2 falls in another plane parallel to the plane of the first box perimeter edge, and so that the first box door perimeter edge 2' falls in one plane and the second box door perimeter edge 3 falls in another plane parallel to the plane of the first box door perimeter edge 2'. The wall 99-2 extends perpendicular to the wall 99-1 and is enclosed around its perimeter by the first box door perimeter edge 2'. Within the wall 99-2, on the underside, are cone shaped receptors 57-1 and 57-2 which are alignment cones for receiving the cones 56-1 and 56-2 which protrude from the port door 60.

In FIG. 3, the port plate 50 and the guide rail surround the port opening 58. Around the perimeter of the port opening is a first plate perimeter edge 1' on surface 40 adjacent the guide rail 55. The direct plate perimeter edge 1' in the port plate 50 is adapted to receive a first box perimeter edge 1 of the box 90. Also the guide rail 55 has a slotted opening 44 for receiving the tab 34 from the box 99.

In FIG. 3, the opening 58 is large enough such that the box door 99 will slide through the opening with a clearance distance. When assembled together, the second box door perimeter edge 3 which is the bottom end of the wall 99-1 extends to the opening 58 to mate with a port door perimeter edge 3' around the raised portion of the port door 60. A second port door perimeter edge 4 of the port door 60 is designed abut with a second plate perimeter edge 4' of the port plate 50 to form a fourth seal.

The port door 60 includes four actuator pins 17-1, 17-2, 18-1 and 18-2. These pins extend above the plane of the first port door perimeter edge 3' so as to extend above the surface 40 and align with springs, such as the spring 19-2 attached to the vertical wall 99-1 of the box door 99.

Figure 4:
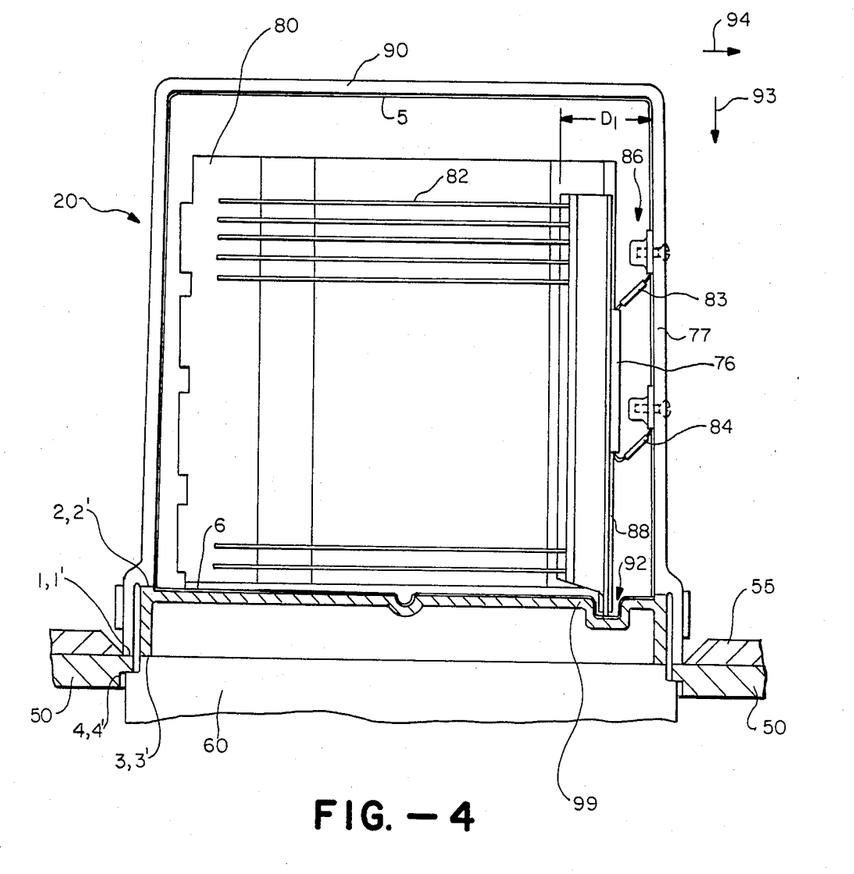
FIG. 4 depicts a cross-sectional front view of a box having a retainer and portions of the port assembly with the box door and retainer in the closed position.

The box 90 has the first box door perimeter edge 1 which forms a seal 1, 1', as shown in FIG. 4, with the first plate perimeter edge 1' on the top surface of the mounting plate 50. The box 90 has the second box perimeter edge 2 which, together with the first box door perimeter edge 2', forms a second seal 2, 2' between the box 90 and the box door 99.

The box door 99 includes the second box perimeter edge 3 for forming a seal 3, 3' with the port door 60 as shown in FIG. 4. The port door 60 includes the second port door perimeter edge which together with the second plate perimeter edge 4' forms a seal 4, 4' as shown in FIG. 4 with the mounting plate 50. Thus four seals formed by respective abutting perimeter edges 1 and 1', 2 and 2', 3 and 3', and 4 and 4' extend around the entire circumference of the box and enclose the port opening 58. Accordingly, the box 90 and the canopy can be under vacuum or pressure.

The port door 99 has a vertical wall 99-1 having an opening 97-1. A spring extends through the opening 97-1 in wall 99-1 and engages a registration plug 16-1. When the spring 19-1 engages the plug 16-1, the box door 99 is held engaged with the box 90 so that a good seal is made in the region 2. As shown in FIG. 3, the spring 19-2 engages the plug 16-2.

The springs, like spring 19-2 are held engaged by spring operation. To disengage the springs a solenoid and actuating arms are translated. Vertical pins connecting through holes in the springs such as vertical pin 18-1 connecting through a hole in spring 19-2, operate to withdraw the springs from the plugs 16-1 and 16-2. When withdrawn, the box door 99 can be separated from the box 90.

In FIG. 4, further details of the port assembly 20 are shown with the cassette 80 fully inserted into the box 90.

The box door 99 and the port door 60 are both closed and the box 90 is latched in contact with the port plate 50. In this position, the port assembly of FIG. 4 has all of the seals 1, 1' and 2, 2' and 3, 3' and 4, 4' closed.

The port assembly of FIG. 4 includes a retainer 86 which functions to hold the wafers 82 within the cassette 80. The retainer 86 includes a retainer tongue 87 which is either in contact with or within a clearance distance of the edge of the wafers 82. In this closed position, tongue 87 prevents any of the wafers 82 from any substantial movement in the direction of arrow 94. The cassette 80 holds the cassettes 82 and prevents them from moving in any substantial amount in the direction of arrow 93.

The retainer 86 includes a box door member 88 which extends along the length of tongue 87 and is in contact with the box door 99 in the region of recess 92. Attached to the door member 88 is one parallelogram arm 76. Attached to the arm 76 are two side parallelogram arms 83 and 84. The side arms 83 and 84 attach to the box 90 at two display locations which form the parallelogram arm 77. The arms 76 and 77 are the same length as are the side arms 83 and 84. Arms 83 and 84 are pivotively connected to both the arms 76 and 77. Whenever the box door 99 is opened and moves in the direction of arrow 93, the member 88 is lowered also in the direction of arrow 93, by the operation of gravity, causing the side arms 83 and 84 to pivot. The pivoting of the arms 83 and 84 causes the tongue 87 to travel not only in the direction of arrow 93, but also in the direction of arrow 94, thereby retracting the tongue 87 away from the wafers 82. The tongue 87 moves uniformly at the top of the wafers 82 and the bottom of the wafers 82 in the direction of the arrow 94.

Figure 5:
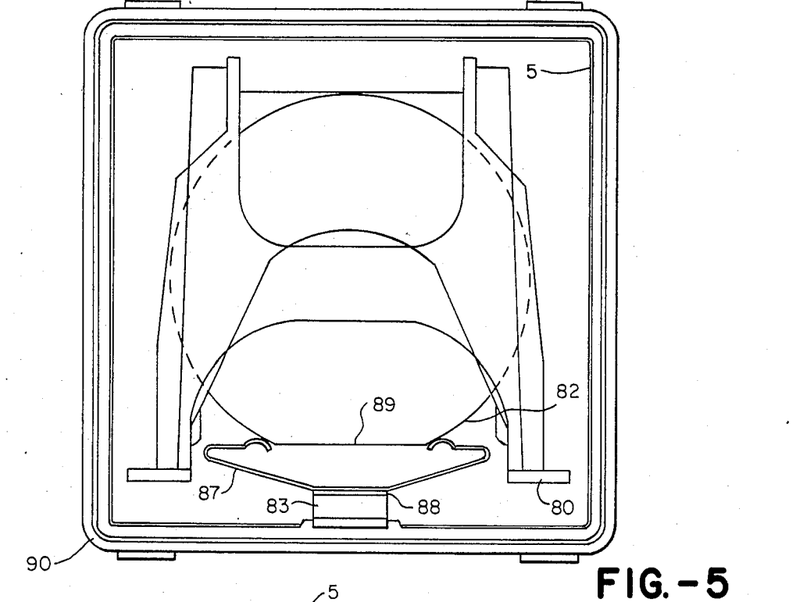
FIG. 5 depicts a top view of the FIG. 4 apparatus.

In FIG. 5, a top view of the box of FIG. 4 is shown. The tongue 87 is wide enough to extend to either side of the flat edge 89 of the wafer 82. In FIG. 5, the wafer tongue 87 is shown in the closed position, represented in FIG. 4.

Figure 6:
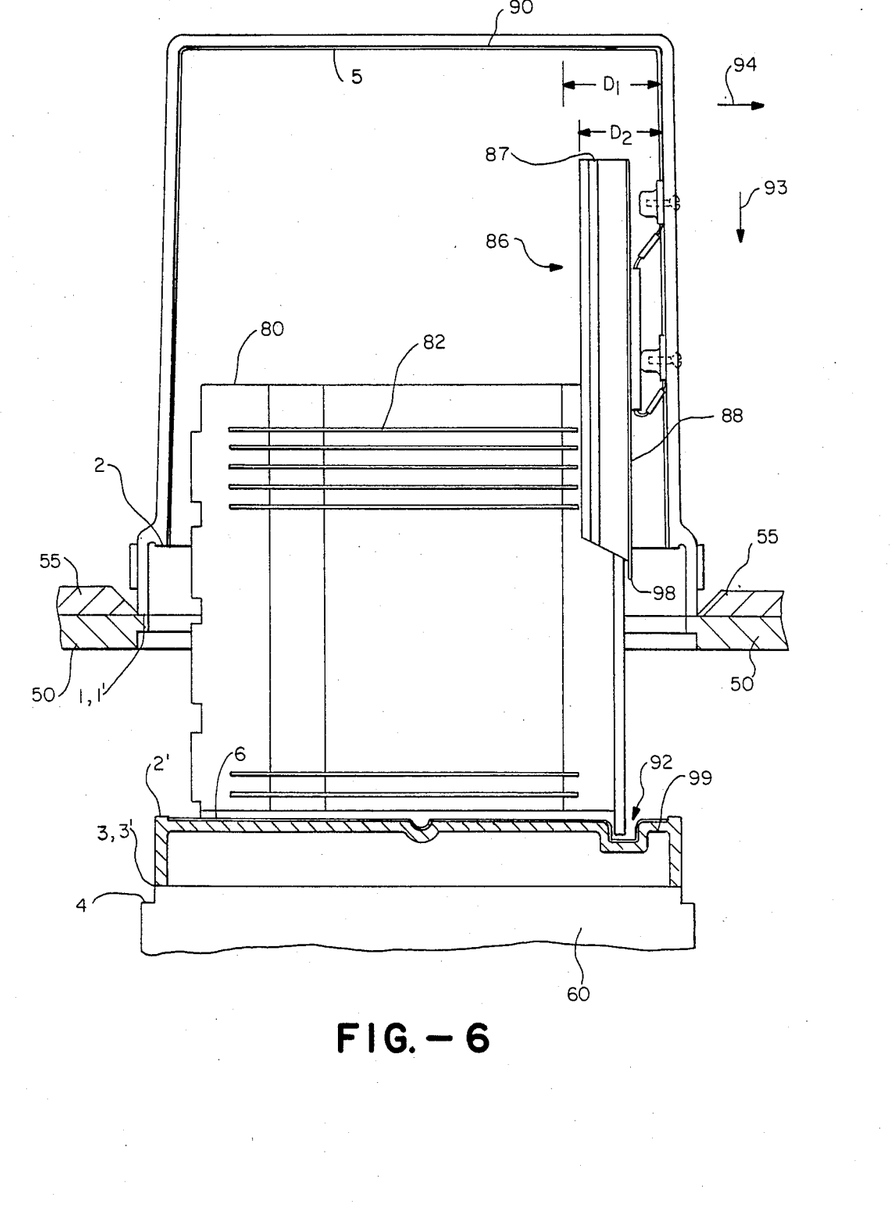
FIG. 6 depicts a front view of FIGS. 4 and 5 apparatus with the box door and retainer in the open position.

In FIG. 6, the box and port assembly of FIGS. 4 and 5 is shown with the box door 99 and the port door 60 moved downward in the direction of arrow 93 toward the open position. In FIG. 6, the tongue 87 has been translated in the direction of arrow 94 from its previous displacement $D_1$ to a shorter displacement $D_2$ as measured from a vertical line approximately at the inner surface of the vertical wall of box 90. The opening, as measured between the displacements in $D_1$ and $D_2$, enables the cassette 80 and the wafers 82 to be easily withdrawn in the direction of arrow 93 out of the box 90. In a similar manner, when wafer 82 and cassette 80 are to be returned back into the box 90, that is moved in a direction opposite to that of arrow 93, the retainer 86 remains open at $D_2$ position until the depression 92 in the box door 99 reaches the bottom position 78 of the box member 88. When the box door 99 and depression 92 reach the position 98, just prior to the time that the seals 2, 2' and 4, 4' are made, the tongue 87 begins to translate in the direction opposite to that of arrow 94 from the $D_2$ to the $D_1$ position. After that time, when the box door 99 has been fully inserted to make seal 2, 2', the box 90 and the box door 99 can be unlatched from the port plate 50 and the retainer 86 remains with the tongue 87 in the closed position at $D_1$. Even though the box 90 may be jarred or bumped, the wafers 82 are restrained from any substantial movement. This restraint tends to reduce the movement of contamination particles.

Within the box 90 is a box liner 5 which although internal to the box 90, is external to the cassette 80 and the wafers 82. The box liner 5 sits upon a base liner 6 which is positioned beneath the cassette 80 on the box door 99. The box liner 5 and the base liner 6 are each made of a noncontaminating material such as a fluoroplastic. A fluoroplastic is a generic name for polytetrafluoroethylene and its copolymers. One such well known fluoroplastic is marketed under the trademark Teflon. Such fluoroplastics are made by well-known techniques to be thin transparent films of approximately 0.0001 inch (0.0025 millimeter) or thinner or of relatively thick, more dimensionally stable, dimensions of, for example, 0.0025 inch (0.063 millimeter).

With any thickness fluoroplastic films are manufactured by processes which result in a relatively small number of contaminant particles where those particles are small (generally less than 0.1 micron). Furthermore, the contaminants which do exist are fluoroplastic contaminants which are non-reactive. In general, fluoroplastic contaminants are chemically inert in semiconductor processing although they can cause physical imperfections. In general, fluoroplastic contaminants of a given size are more tolerable than other types of contaminants which appear as a result of equipment and semiconductor materials.

The box liner 5 and the base liner 6 in FIG. 2 are disposable liners. When the box 90 is to be loaded, prior to processing, with the cassette 80 and new wafers 82, any old liner previously in the box is discarded and a new liner is inserted. Accordingly, any contaminants which may exist on the box 90, resulting from previous uses in different process locations, are shielded from the wafers 82 and the cassette 80 by the liner 5 and the liner 6.

Because the liner 5 and the liner 6 are soft flexible fluoropastics, the operation of inserting and retracting the cassette 80 into and out of the box 90 of FIG. 2 permits the plastic liner to shrink or expand in volume. The change in volume minimizes the turbulence of any surrounding gas, such as air, resulting from insertion and retraction of wafers into and out of the box 90. The filtered air vent 91, when employed (see FIG. 7), allows any differential air pressure from inside to outside the box to be equalized. Any movement of air (or other gas) tends to be between the liner and the box. Therefore, the air surrounding the wafers and inside the box liner 5 tends to remain still.

In one embodiment, the liners 5 and 6 are an electret material which has the property of attracting and holding small charged particles. Such an electret is formed, for example, by the radiation of fluoroplastic such as liners 5 and 6, with an appropriate radiation (x-ray) source. Such radiation has the effect of separating positive and negative charges within the fluoroplastic thereby importing the electret property to the fluoroplastic.

In another embodiment, the liners 5 and 6 are formed of a conductive material. In one example, the fluoroplastic liner as previously described is formed within a thin conductive mesh so as to provide a static shield around the cassette 80 and the wafers 82. A conductive wire mesh having conductors formed of wires of approximately 0.001 inch (0.025 millimeter) diameter gold with approximately 0.005 inch (0.12 millimeter) spacing is satisfactory.

In another embodiment, the liner 5 includes on its inner surface an adhesive material which tends to hold particles which strike the liner 5.

The liners 5 and 6, when formed of thin fluoroplastic, tend to be transparent thereby facilitating optical observation of the wafers and cassettes. The fluoroplastic or other material can be made translucent or opaque.

In one particular embodiment, the liner is manufactured with a pigment for filtering out unwanted light. In general, the unwanted light is ultraviolet light utilized in photographic exposure of photographic emulsions spread on top of wafers during the wafer processing. Whenever the light-sensitive materials are placed on the wafers, the wafers must be shielded from unwanted exposure. In typical clean rooms, yellow fluorescent lights are employed. Also, red, dark-room lights may also be employed. These lights, however, make it somewhat difficult for operators within the wafer processing environment to have adequate lighting for carrying out other functions. When the box or liners of the present invention are formed as filters, the wafers become adequately protected without need for clean-room yellow or dark-room red to protect the wafers. Because the wafers are maintained within the box and liner and under the canopy, no unwanted ultraviolet or other radiation reaches the wafers.

In FIG. 2, the base liner 6 includes a vertical wall 7 which terminates inside the vertical wall of the box 99 and allows the liner 5 to fit outside the base liner wall 7. In this manner, the base liner 6 and the box liner 5 are in continuous contact so that the cassette 80 and the wafers 82 are totally enclosed by the liner formed by the box liner 5 and the base liner 6. Accordingly, if any contaminants happen to be located within the interior of the box 99, those contaminants are still isolated from the internal region occupied by the cassette 80 and the wafers 82.

Figure 7:
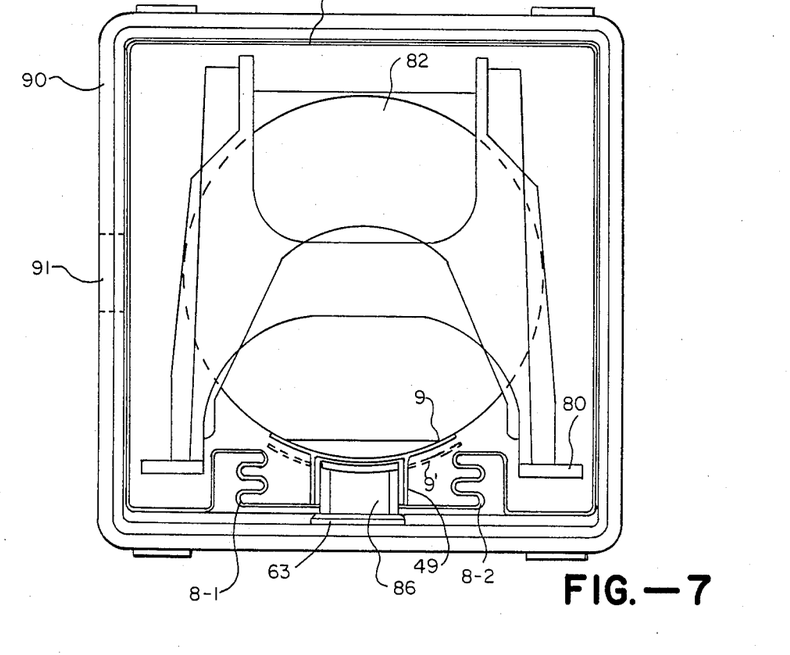
FIG. 7 depicts a top view of another embodiment of a box with a disposable liner in which a spring-operating tongue is formed in one sidewall of the liner juxtaposed a retainer tongue.

In the embodiment of FIG. 7 the box liner 5, being a thin plastic material adheres to the inner surface of the box 99. As shown in FIG. 7 the box liner 5 does not contact the wafers nor the wafer cassette 80 but rather, remains by surface adhesion in contact with the box 99. Accordingly, there is no rubbing of the cassette 80 or the wafers 82 against the liner 5 whenever the cassette is inserted into or withdraw from the box 99.

In FIG. 7, an embodiment is shown wherein the liner includes a mechanically-actuated retainer 86. The loops 8-1 and 8-2 in the liner 5 connect to a liner tongue 9 which rests against the wafers 82 so that the wafers 82 are retained in place within the cassette 80. Both the loops 8-1 and 8-2 and the liner tongue 9 are typically made from the same fluoroplastic material as the rest of liner 5. The loops 8-1 and 8-2 are made thicker than the rest of liner 5 to impart elastic, spring-like force to the tongue 9. Positioned on the outside of the liner 5 and between the loops 8-1 and 8-2, is the retainer 86 similar to the retainer 86 of FIG. 4 but without tongue 87. In place of tongue 87 is a retainer tongue 49 which engages the back of the liner tongue 9. The actuation of retainer 86 to the closed position forces the tongues 9 and 49 toward the wafers 82 thereby compressing the loops 8-1 and 8-2 and moving the tongue 9 in contact with or to within a clearance distance of the wafers 82. The tongue 9 is shown in the retracted position by the broken-line liner tongue 9'.

When the retainer 86 is actuated to the open position, the spring force of the loops 8-1 and 8-2 withdraws the tongue 9 to the open position 9'.

The use of both the canopy 10 and the box 90 as described above excludes human intrusion into the immediate environment of the wafers 82 and avoids the undesireable use of constantly moving filtered air. Cleanliness is achieved by maintaining a still-air interior environment rather than by a filtered moving-air environment. The canopy 10 and box 90 can each be equipped with particle-filtered openings 11 and 91 respectively, as in FIGS. 1 and 7, to allow continuous equalization between internal and external (ambient) air pressures. Such filtered pressure equalization openings 11 and 91 act to minimize pressure differences and, consequently, air flow between the canopy 10 and box 90 as the wafers are moved from the box 90 into the canopy 10. In addition, since access to the interiors of the canopy 10 and box 90 are by means of mechanical arms which occupy essentially constant volume within the enclosures, no significant change in interior volume occurs as IC wafers are moved about.

In many of the embodiments described, the box liner is thin plastic which adheres to the internal surfaces of a mechanically rigid plastic box. However, the box liner itself may be constructed of a thicker plastic which is mechanically and dimensionally stable all by itself. In such an embodiment, the box liner covers the wafer holder and wafers whether or not a rigid external box is employed. In such a case, the retainer 86 is attached to a bracket which forms the arm 77 (see FIG. 4).

In one embodiment, the box liner is formed of a polystyrene and a fluoroplastic lamination. The fluoroplastic is the inside layer and the polystyrene is the outside layer where the polystyrene is added to give mechanical strength.

While the invention has been particularly shown and described with reference to preferred embodiments thereof, it will be understood by those skilled in the art that the foregoing and other changes in form and detail may be made therein without departing from the spirit and scope of the invention.

We claim:

1. A transportable container for articles to be processed, for use with passage means for passing said articles between locations, comprising:
   a box defining a box opening;
   a box door for being received by said box opening;
   holder means for holding one or more articles, said holder means supported by said box door and sized for passage through said box opening, said passage means passing said holder means through said box opening;
   retainer means, movably mounted adjacent to said holder means, for substantially retaining said one or more articles held by said holder means;
   wherein said retainer means is supported by said box door while said box door is received by said box opening; and
   wherein, in the course of passage of said holder means through said box opening, said retainer means has a first component of movement in a direction substantially transverse to movement of said holder means.

2. The container of claim 1 wherein said box defines an interior region; and wherein said retainer means is disposed substantially within said interior region.

3. The container of claim 1 wherein substantially during a passage of said holder means through said box opening, said retainer means moves between a first position and a second position; wherein said second position is transversely displaced farther from said holder means than said first position.

4. The container of claim 3 wherein said holder means substantially is supported by said box door when said holder means is in said first position and said box door is received in said box opening.

5. The container of claim 1 wherein said box defines an interior region; and
   wherein said retainer means moves in a direction substantially toward said holder means during passage of said holder means through said box opening to said interior region; and wherein said retainer means moves in a direction substantially away from said holder during passage of said holder means through said box opening from said interior region.

6. The container of claim 1 wherein said retainer means includes at least one first member pivotally coupled to said box.

7. The container of claim 6 wherein said box defines an interior region; and
   wherein said at least one first member is disposed substantially within said interior region.

8. The container of claim 6 wherein said at least one first member comprises at least one arm member.

9. The container of claim 1 wherein said box defines an interior region; and further comprising first liner means defining a liner opening; wherein said first liner means is disposed substantially within said interior region between said box and said holder means; and wherein said liner opening is sized for passage therethrough by said holder means.

10. The container of claim 9 wherein said first liner means defines a liner opening substantially aligned with said box opening.

11. The container of claim 9 wherein said box has at least one vent port.

12. The container of claim 11 wherein said first liner means comprises a flexible material which can substantially shrink or expand in volume in response to passage of air through said at least one vent port.

13. The container of claim 11 wherein said first liner means comprises a flexible flouroplastic material.

14. The container of claim 9 and further comprising second liner means disposed substantially between said box door and said holder means.

15. The container of claim 1 wherein said box includes a first box perimeter edge disposed adjacent to said box opening; and wherein said box door includes a first box door perimeter edge for substantially abutting against said first box perimeter edge when said box is received in said box opening such that said abutting edges substantially form a seal.

16. The container of claim 15 wherein said box includes a second box perimeter edge, said first and second box perimeter edges being displaced from one another in substantially parallel planes; and further comprising latch means for latching said box to said box door; wherein said latch means is disposed substantially between said first and second box perimeter edges when said box door is received by said box opening.

17. The container of claim 15 wherein said box door is characterized by a substantially H-shaped cross-section; and wherein said box door includes a first box door perimeter edge which forms a top of vertical sides of said H, and includes a second box door perimeter edge which forms a bottom of the vertical sides of said H.

18. A transportable container for articles to be processed, for use with passage means for passing said articles between locations, comprising:

a box defining an interior region and a box opening;

a box door for being received by said box opening;

holder means for holding the articles, said holder means supported by said box door and sized for passage through said box opening, said passage means passing said holder means through said box opening;

retainer means, extending adjacent to said holder means, for substantially retaining the articles held by said holder means; wherein said retainer means is movable substantially, during a passage of said holder means through said box opening, between a first position and a second position; wherein said second position is transversely displaced farther from said holder means than said first position; and wherein said retainer means substantially is supported by said box door when said holder means is in said first position.

19. The container of claim 18, wherein said retainer means includes at least one first member; and further comprising, at least one second member secured in a substantially fixed position relative to said box opening within said interior region; and wherein said at least one first member comprises at least one arm member including a first segment pivotally secured to said retainer means and a second segment pivotally secured to said at least one second member.

* * * * *